United States Patent [19]
Gerdes et al.

[11] Patent Number: 5,200,715
[45] Date of Patent: Apr. 6, 1993

[54] WAVEFORM MODULATION AND DEMODULATION METHODS AND APPARATUS

[75] Inventors: Richard C. Gerdes; Mary K. Gerdes, both of Scotsdale, Ariz.

[73] Assignee: WavePhore, Inc., Tempe, Ariz.

[21] Appl. No.: 756,180

[22] Filed: Sep. 6, 1991

[51] Int. Cl.$^5$ .............................................. H03C 1/00
[52] U.S. Cl. ..................... 332/185; 332/151; 332/168; 332/177; 455/46; 455/102; 455/109
[58] Field of Search ............... 332/145, 146, 149, 151, 332/152, 167, 168, 170, 172, 174, 176, 177, 178, 185; 455/46, 47, 102, 109; 375/43, 61

[56] References Cited

U.S. PATENT DOCUMENTS

| | | | |
|---|---|---|---|
| 2,304,135 | 12/1942 | Wise | 332/167 |
| 4,613,974 | 9/1986 | Vokac et al. | 375/37 |

OTHER PUBLICATIONS

Gerdes, Richard. "Using Genesys TM HDTV Technologies for Today's Expanded NTSC Service". Presented at 1990 Spring Engineering Conference, Nat'l Assoc. of Broadcasters, Apr. 1, 1990. Atlanta, Ga.

Gerdes, Richard. "Waveform Modulation as Used in Television Applications". Presented at RF Technology Expo 90, Mar. 28, 1990, Anaheim, Calif.

Gerdes, Richard. "Genesys TM HDTV Technologies Expand Existing NTSC Service". Presented at The 24th Annual SMPTE Television Conference, Society of Motion Picture and Television Engineers, Jan. 26, 1990, Lake Buena Vista, Fla.

Gerdes, Richard. "Arizona Based HDTV:; The Genesys TM Technologies". Presented at Phoenix Chapter of the Society of Broadcast Engineers, Arizona Broadcasters Association Fall Meeting, Nov. 10, 1989. Phoenix, Ariz.

Gerdes, Richard. "HDTV Management Timetable". Presented at Challenges in Teleproduction, The Internat'l Teleproduction Society Annual Forum, Sep. 17, 1989. Los Angeles, Calif.

Gerdes, Richard. "The Use of Genesys Technology for HDTV". Presented at the 130th SMPTE Technical Conference, Society of Motion Picture and Television Engineers, Inc., Oct. 15-19, 1988. New York, N.Y.

*Primary Examiner*—Siegfried H. Grimm
*Attorney, Agent, or Firm*—Spensley Horn Jubas & Lubitz

[57] ABSTRACT

A new method of modulating and demodulating signals and circuitry therefor is disclosed. The modulation circuit defines a non-linear voltage current transfer function wherein at low voltage levels the current voltage transfer function is substantially linear and at higher voltages, the transfer function is substantially exponential. The modulation circuit can be designed of three parallel branches, a resistive branch, and two diodes in the remaining branches, the anode of one diode being coupled to the cathode of the other diode. Demodulation circuitry is also disclosed that includes a circuit for determining the instantaneous phase and amplitude and then processing circuitry to decode the modulation information based upon the sampled phase and amplitude data.

13 Claims, 10 Drawing Sheets

WAVEFORM MODULATION AND DEMODULATION METHODS AND APPARATUS

BACKGROUND OF THE INVENTION

1. Field of the Invention

This invention relates to techniques of modulating a carrier by changing its waveform without altering its frequency, phase or amplitude. In particular, this invention relates to a form of modulation called waveform modulation.

2. Description of the Prior Art

Modulation of a carrier signal with information contained in a modulation signal is well known in the art. Common techniques include pulse modulation, amplitude modulation, phase modulation, frequency modulation and quadrature amplitude modulation. Typically, in such forms of modulation, a sine wave is used as a carrier.

The selection of the modulation technique, of course, alters parameters of that carrier sine wave such as whether there is a sine wave (pulse modulation), the amplitude of the sine wave (amplitude modulation), the phase of the sine wave (phase modulation), the frequency of the sine wave (frequency modulation) and the amplitude of both a sine and a cosine wave carrier (quadrature amplitude modulation). Depending upon the selection of the modulation technique, the permitted bandwidth for the trasmitted signal and the expected signal to noise ratio in the communications channel, the maximum data transmission rate can be calculated.

Generally, as the sophistication of the modulation technique increases, the complexity of the circuitry required for the transmitter and the receiver increases. For example, in quadrature amplitude modulation, computers are frequently used for demodulation.

To maximize the data transmission rate, numerous techniques have been devised for transmitting two signals in the same bandwidth. For example, a common technique used in satellite communications is to have orthogonally polarized waves transmitted at the same frequency. However the polarization of such orthogonally polarized waves can be substantially degraded by precipitation. Other techniques include frequency interleaving such a used in the NTSC television standard.

Theoretically, for example, a phase shift keyed signal can imposed upon an amplitude modulated carrier to increase the transmission rate. However, the demodulation circuitry for such a transmitted signal is complex to avoid artifacts in the demodulated phase modulated data occurring in the demodulated amplitude signal.

Thus, it is a first goal of this patent to arrive at a new way of modulating a carrier signal with information without requiring complex circuitry for the transmitter or the receiver. It is a further object of the invention to modulate and demodulate the signal in a manner that allows for a maximum data rate. It is yet another object of the instant invention to have the modulated signal to be transparent to other types of signals.

SUMMARY OF THE INVENTION

These and other objects are accomplished by a new form of non-linear modulation hereinafter called waveform modulation. To modulate the signal, a subcarrier of half the frequency of the carrier is applied to one node of a non-linear circuit such as a three branch antiparallel circuit. The parallel circuit comprises a resistive branch, and two non-linear branches, preferably diodes having forward biased current flow in opposite directions, comprise the remaining two branches.

The modulation signal and the subcarrier applying the modulation signal are applied to the three branch circuit in a variety of configurations. One example involves coupling the subcarrier to a first node of the cell and the modulation signal through a voltage divider to the other node of the three branch antiparallel circuit, which also forms the output node of the modulator. Other embodiments include single-ended outputs, and using a microprocessor with a memory table lookup to emulate the characteristics of the cell.

It has been found that the output of such a modulator has all of the modulated information contained in sidebands at each of the even harmonics of the subcarrier while the even harmonics of the subcarrier are themselves suppressed. Further, the transmitted signal is virtually symmetrical about the real amplitude/frequency plane. Thus, a waveform modulated signal and a frequency or amplitude modulated signal can be transmitted in the communications channel simultaneously without causing any detectable artifacts in either of the demodulated signals Demodulation can be accomplished readily with a simple circuit that determines the amplitude and phase of the modulated waveform. A computer or dedicated processing circuit can then use the phase and amplitude information to reconstruct the input signal.

To obtain both the amplitude and the phase information, a synthesized carrier is multiplied by a first multiplier or balanced modulator by the transmitted waveform modulated signal plus a DC offset. The resultant first product signal is then applied to one input of a second multiplier or balanced modulator and the other input to the second multiplier is the first product signal passed through a tank circuit resonant at the carrier frequency. The output of the second multiplier after low pass filtering represents the instantaneous amplitude of the waveform modulated signal. To obtain the phase signal, the resultant first product signal is applied to the input of a third multiplier or balanced modulator and the other input for that third multiplier is the resultant product passed through a tank circuit resonant at the carrier frequency and phase shifted by ninety degrees. After low pass filtering, the product signal from the third multiplier represents the instantaneous phase.

DETAILED DESCRIPTION OF THE PREFERRED EMBODIMENTS

Figure 1:
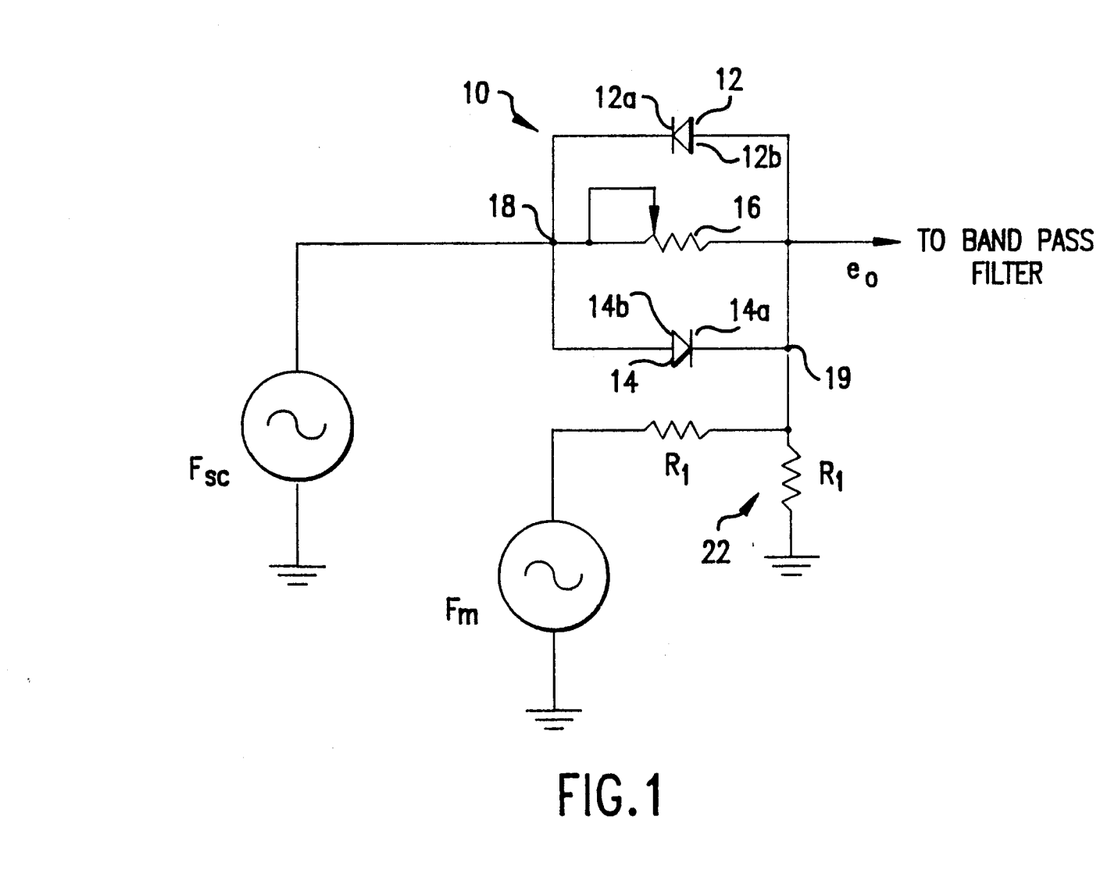
FIG. 1 is a schematic diagram of the modulation circuit of the present invention.

FIG. 1 shows a detailed schematic of a preferred embodiment of the modulation circuit The modulator comprises a non-linear antiparallel circuit or modulator cell 10, a subcarrier input $F_{sc}$ and a modulator input, $F_m$ and an output, $e_o$. The non-linear, antiparallel circuit in the preferred embodiment comprises two diodes 12 and 14 as separate branches coupled in an antiparallel relationship. By antiparallel, it is meant that the anodes 12a and 14a and the cathodes 12b and 14b of the diodes are coupled so the direction of forward biased current flow of the two diodes are opposite. A linear element such as a resistor 16 comprises the third branch of the modulator cell 10.

The subcarrier signal $F_{sc}$ is applied to one input node 18 of the antiparallel circuit or modulator cell 10 and the modulation information $F_m$ is applied to the other node 19 through an isolation circuit such as a buffer amplifier (not shown) or a voltage divider 22. To avoid overmodulating the subcarrier, the peak to peak voltage of the modulated signal $F_m$ appearing at the node 19 when no subcarrier is present should be preferably less than one half the peak to peak signal of the subcarrier $F_{sc}$.

Figure 2:
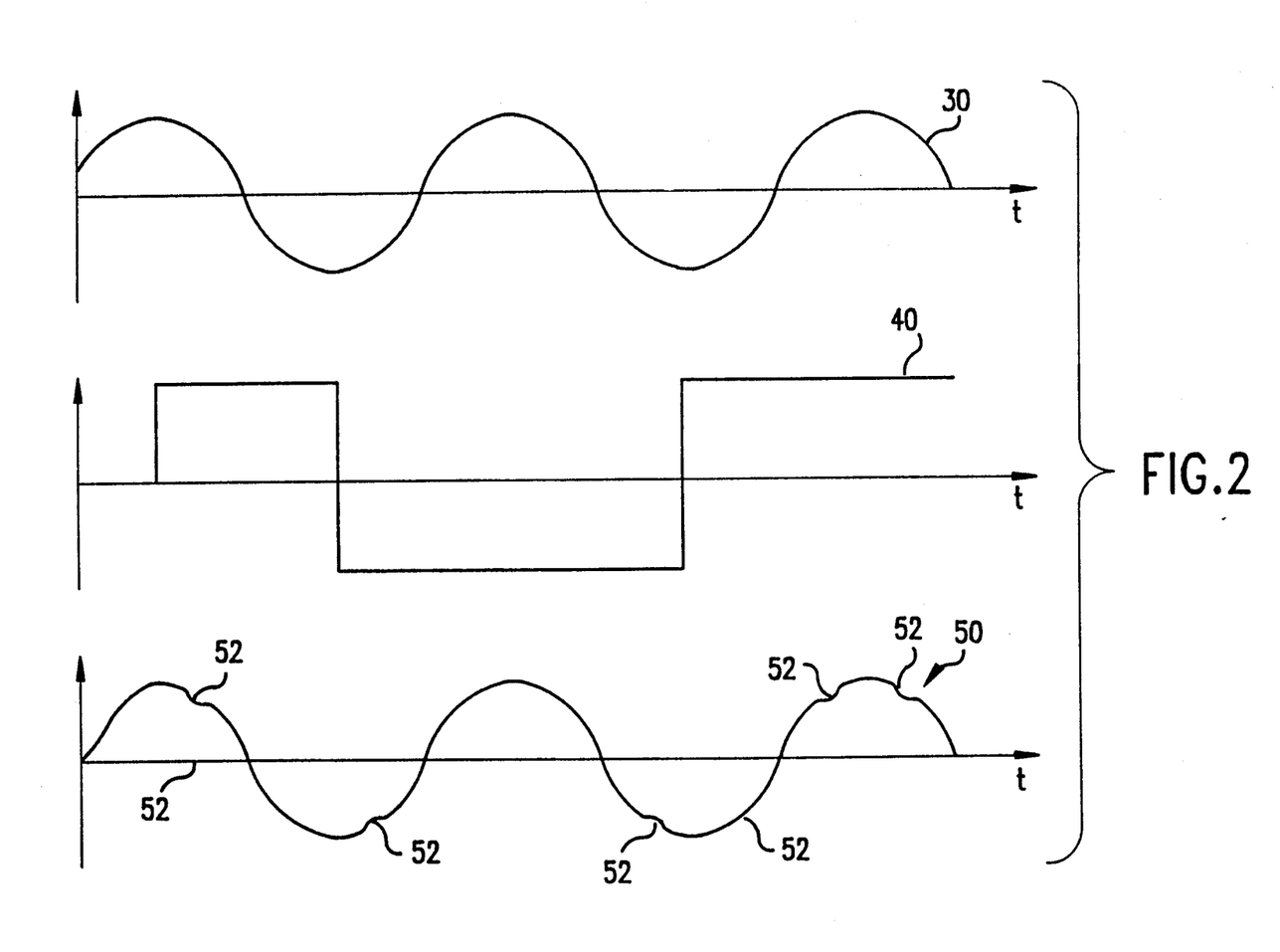
FIG. 2 is a diagram of various waveforms that are useful in explaining the operation of the modulation circuit of FIG. 1.

FIG. 2 shows how the nonlinear antiparallel circuit or modulator cell 10 causes modulation of the waveform. The subcarrier in this example is a sine wave 30 having a frequency $f_{sc}$ and a peak to peak amplitude between preferably 2-3 volts. The modulation signal $F_m$ is, for example, a digital signal 40 varying between plus and minus one half of one volt (at the node 19 when no subcarrier is present) and the diodes 12 and 14 are silicon diodes The output signal is shown at 50.

Inflection points 52 in the output signal result from the non-linear characteristics of the diodes 12 and 14. When the magnitude of the voltage difference across the antiparallel circuit or the modulator cell 10 is below the threshold voltage of the diodes, the diodes are essentially non-conductive. Current flow through the antiparallel circuit is essentially through the resistive branch as one diode is reverse biased and the other only allows a small current. As the voltage difference across the antiparallel circuit increases past the threshold voltage of the forward biased diode, the forward biased diode starts conducting with current increasing exponentially with voltage. Due to the exponential increase of current conduction by the forward biased diode, inflections 52 result in the waveform 50 as nonlinear current flow becomes more significant. The slope at the inflection points 52 depends upon the resistance of the resistor 16. As the resistance increases, the slope at the inflection points 52 becomes flatter.

Figure 6:
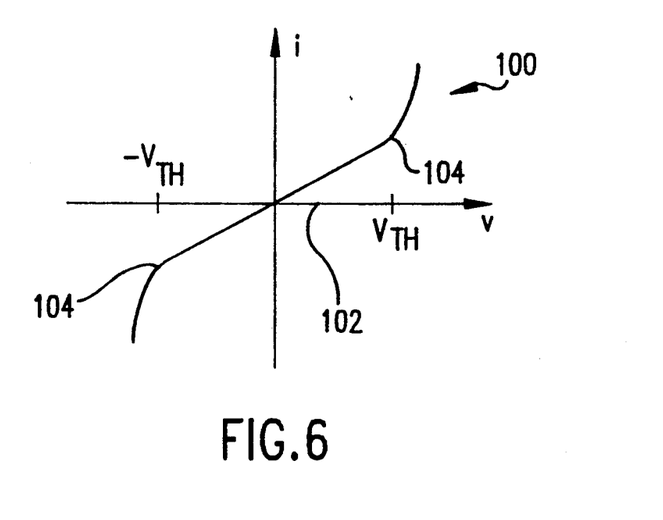
FIG. 6 is the voltage current transfer curve for the modulation circuit of FIG. 1.

FIG. 6 shows the voltage current transfer curve 100 for the disclosed non-linear waveform modulation circuit or cell 10. At relatively low potential differences (i.e., less than three tenths of a volt for silicon diodes), the current through the diode branches of the nonlinear circuit is relatively insignificant. One diode is reverse biased while the other diode is not sufficiently forward biased to conduct substantial current. Thus, most of the current flow through the non-linear circuit is through the resistive branch, which defines the linear portion 102 of the transfer curve 100. However, as the magnitude of the voltage difference across the non-linear circuit increases beyond the threshold voltage of the diodes, the forward biased diode begins to conduct appreciable amounts of current. This results in bends or knees 104 in the voltage-current transfer curve with the exponentially increasing current of the forward biased diode branch predominating past the knees 104. It can also seen that this voltage current characteristic curve is symmetric about the current axis. Of course, the reverse biased diode remains essentially non-conductive and contributes virtually no current flow through the non-linear circuit.

As can be seen from the depictions of the waveform of the modulated carrier, the disclosed modulator circuitry alters the waveform of the carrier. Thus, the disclosed modulator circuitry is referred to as waveform modulation. It should also be understood that although the exemplary modulation signal in FIG. 2 merely has two digital levels, the modulation signal can have N different levels allowing parallel data transmission or the modulation signal can be a true analog signal having an infinite number of levels. As the number of levels increases, the number of different levels at which an inflection can occur on the waveform increases.

Figure 3:
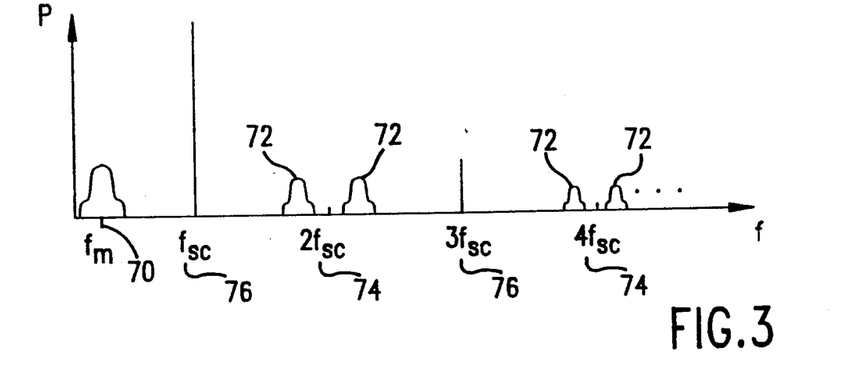
FIG. 3 is a representative diagram of the frequency power spectra of modulated data for the modulator of FIG. 1.

FIG. 3 shows an exemplary power spectra of the modulated output of the modulator, where the subcarrier frequency is $f_{sc}$ and the modulation frequency bandwidth is centered at $f_m$. As can be seen in FIG. 3, the modulated information is present in the sidebands 72 at the even harmonics 74 of the subcarrier $F_{sc}$. When the ratio of the amplitude of the subcarrier to the modulation signal $F_m$ is properly controlled, the fundamental and the other odd harmonics 76 lack any information as exhibited by the absence of sidebands. Further, the power spectra demonstrates that the even harmonics of the subcarrier are suppressed.

It should be understood that the optimal ratio of the amplitude of the subcarrier $F_{sc}$ to the amplitude of the modulation signal $F_m$ varies with the diode type used. In selecting that ratio, it is preferred that the ratio be selected so that the power spectra of the output of the modulator cell 10 resembles that of FIG. 3. In particular, the ratio should be selected to maximize the energy at the sidebands 72 of the second harmonic of the subcarrier $F_{sc}$.

It has been further found that if the ratio of the amplitudes of the modulation signal $F_m$ and the subcarrier $F_{sc}$ approaches unity, sideband energy at the even harmonics, including the fundamental, increase above the noise level and are detectable. It has also been noticed that the sideband energy at the odd harmonics are spaced at twice the modulation frequency from the odd harmonics, e.g., $n \cdot f_{sc} \pm 2f_m$, where n is an integer and f represents frequency. It appears that an even harmonic sideband could be transmitted but this technique is not believed to be as efficient in using spectra or power.

Empirical studies have demonstrated that each of the sidebands 72 at the second harmonic of the subcarrier contains all of the modulated information. To ease the design of the power amplifier, the output of the modulator may be supplied to a bandpass filter (not shown) centered at twice the subcarrier frequency and having a bandwidth of twice the highest frequency of the modulation information for double sideband transmission. The output of the bandpass filter may then be supplied to a power amplifier (not shown) for transmission. The resultant output of the waveform modulator including such a bandpass filter is a waveform modulated signal having a suppressed carrier $F_C$ at twice the frequency of the subcarrier $F_{sc}$.

Preferably, however, single side band transmission is used to utilize spectra more efficiently. In that case, a cutoff frequency of the filter should be substantially equal to twice the frequency $f_{sc}$ of the subcarrier $F_{sc}$ and the filter's bandwidth should be approximately equal to the bandwidth of the modulation signal $F_m$.

Figure 4:
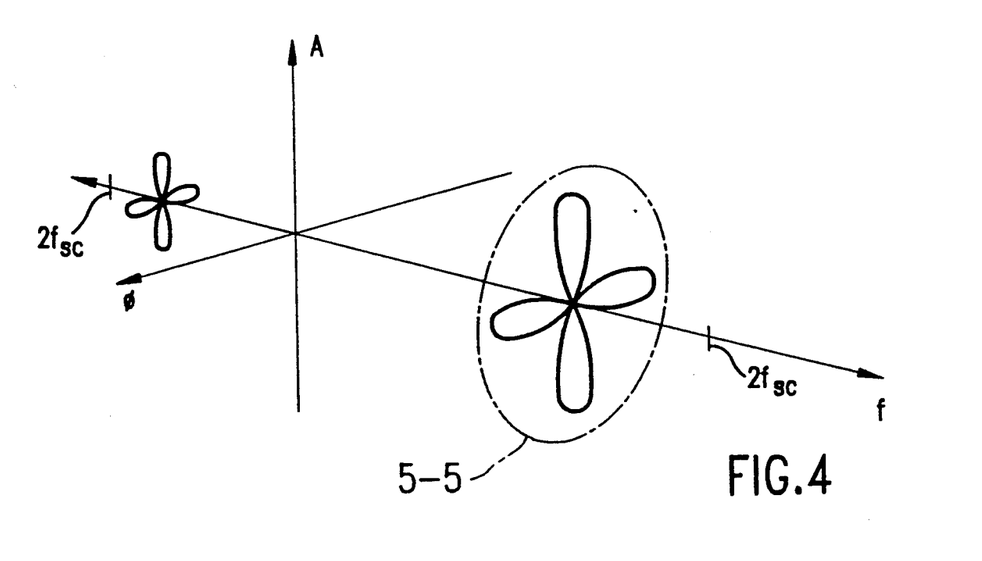
FIG. 4 is a three dimensional diagram of the frequency, amplitude and phase domain of the spectra for an output signal from the modulator of FIG. 1.

In addition, to the power spectra shown in FIG. 3, phase, amplitude, and frequency measurement plots demonstrate that the modulated information is substantially symmetric with the amplitude frequency plane. FIG. 4, which represents an exemplary three dimensional surface plot of phase, amplitude, and frequency for a waveform modulated signal, demonstrates this symmetry. As shown in FIG. 4, the portion of the phase, amplitude, and frequency surface for the modulated signal is substantially symmetrical in each of the 8 sectors defined by the axes.

Figure 5:
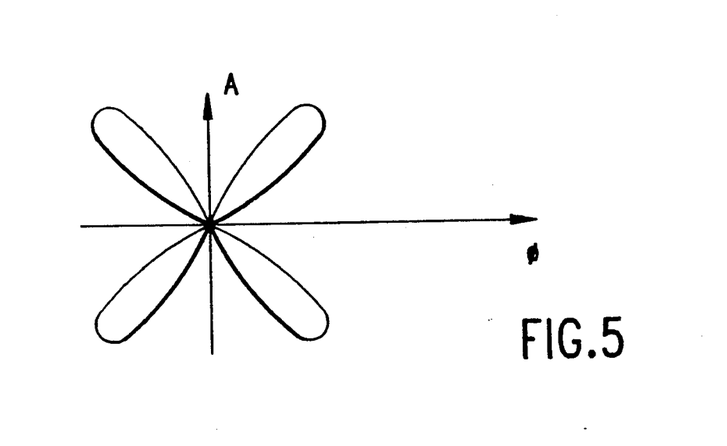
FIG. 5 is a phase/amplitude plane defined by lines 5—5 in FIG. 4 at the frequency of $2f_{sc}-f_m$.

This symmetry can be further seen in FIG. 5. FIG. 5 shows the phase-amplitude cross-sectional plot of the surface of FIG. 4 plot taken at a frequency equal to $2f_{sc}-f_m$ in FIG. 4, where $f_{sc}$ is the subcarrier frequency and $f_m$ is the modulation frequency. As can be seen in FIG. 5, the plot of amplitude versus phase is substantially symmetrical in all four quadrants.

Due to this symmetry, a waveform modulated signal is transparent to common frequency modulation signal or amplitude modulation receivers. Amplitude modulation receivers operate almost exclusively along the amplitude axis where the phase is essentially zero and the frequency is fixed. Frequency modulation receivers operate almost exclusively along the frequency axis with essentially a fixed phase and a fixed amplitude. Tests demonstrate that a waveform modulated signal can be transmitted in the same frequency band as an amplitude or frequency modulated signal without the amplitude or frequency demodulator detecting the presence of the waveform modulated signal.

Piecewise linear approximation techniques applied to the voltage current transfer curve shown in FIG. 6 demonstrates mathematically that the disclosed modulation circuit will act as a waveform modulator as shown by the exemplary plots of FIGS. 3, 4, and 5. Further, these approximation techniques and empirical measurements demonstrate that the ratio of the subcarrier peak to peak amplitude to the threshold voltage of the diodes should remain approximately within the range of 1.5-5 for the antiparallel circuit or cell 10.

The diodes for the antiparallel circuit or cell 10 should be selected based upon the frequency of the subcarrier. For example, for subcarriers below 25 megahertz, silicon diodes having low junction capacitance may be used. For significantly higher subcarrier frequencies, gallium arsenide diodes should be used. The resistor should have a relatively low resistance, resistances less than ten ohms and up to at least 100 ohms have been found to be adequate. Further, the disclosed nonlinear, antiparallel circuit or modulator cell 1 can be readily fabricated as part of an integrated circuit and the resistor 16 can be a fixed value resistor. Laser trimming or other well known techniques may used for adjusting the resistor 16

An alternative embodiment for the disclosed invention is to create the modulated signal through the use of a microprocessor or a specialized digital control circuit (not shown). Based upon a reference clock signal for the microprocessor or the digital circuit and the desired modulation data, the microprocessor can be programmed to output digital data representative of a waveform modulated signal by using, for example, a memory table lookup. The data for the memory table lookup can be generated by empirical measurement using the cell 10. By treating the high and low portions of the reference clock signal as the positive and negative halves of the subcarrier sine wave, a comparison can be done between the level of the modulation signal and the elapsed time from a transition in the clock in the manner that the cell 10 compare the modulation signal level with the level of the subcarrier. That digital data can then be digitally band pass filtered and converted into an analog signal for transmission or that digital data can be converted into an analog signal and band pass filtered. Further, if the empirical measurements for the table are taken after bandpass filtering, no bandpass filtering is needed.

Figure 10:
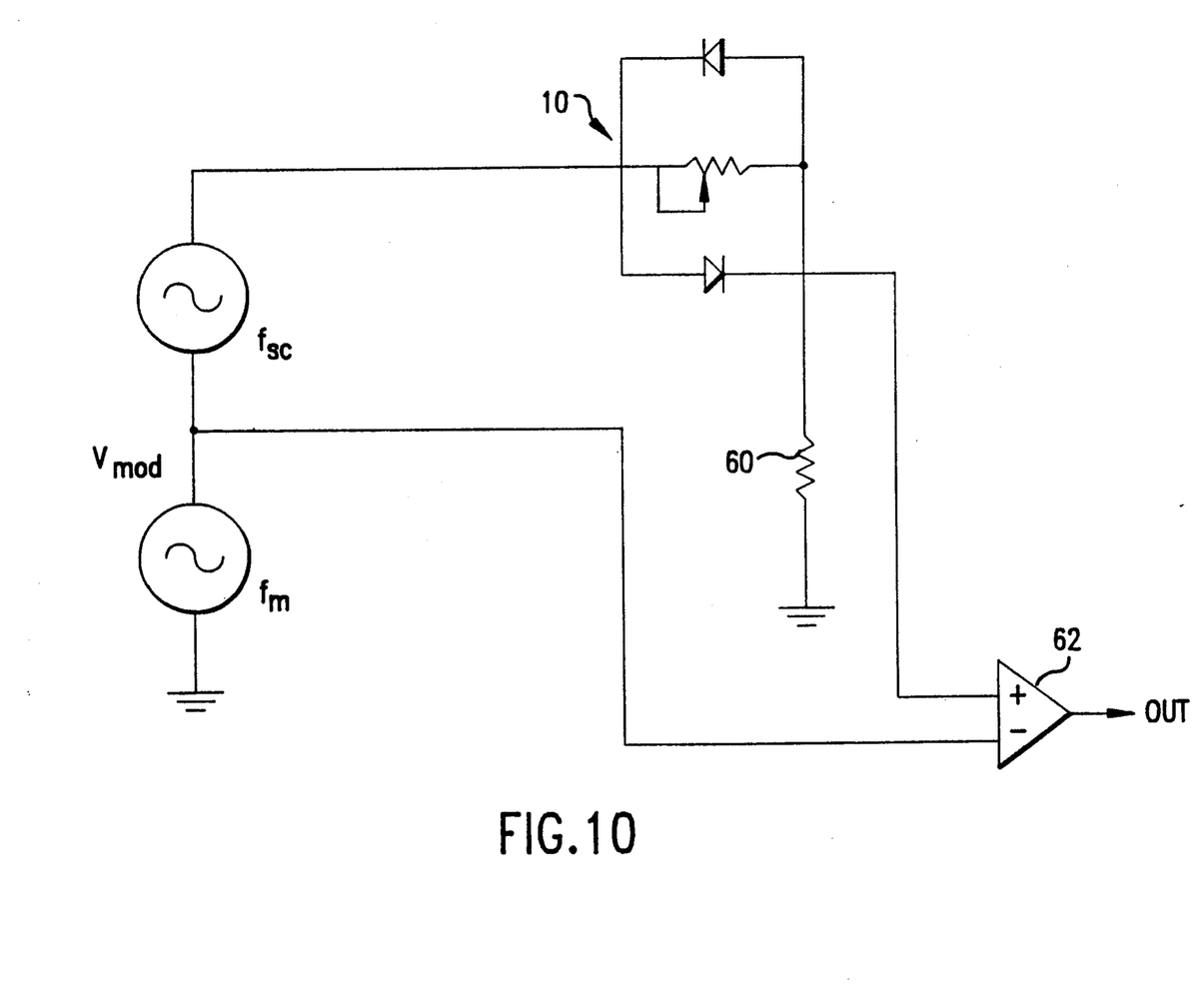
FIGS. 10-13 are alternative embodiments of the modulator for FIG. 1.

FIG. 10 shows an alternative embodiment for the modulator. The same nonlinear antiparallel circuit or modulator cell 10 of FIG. 1 is used but the subcarrier $F_{sc}$ and modulation signal $F_m$ are coupled in series and the subcarrier is applied to one node of the cell. The output current of the cell 10 is applied across a load resistor 60 to develop a sample voltage of the modulated output. This sample voltage also includes as a component the modulation signal $F_m$. To avoid the modulation signal $F_m$ from appearing in the output, a portion of the modulation signal $F_m$ is supplied to a differential amplifier 62 for elimination.

Figure 11:
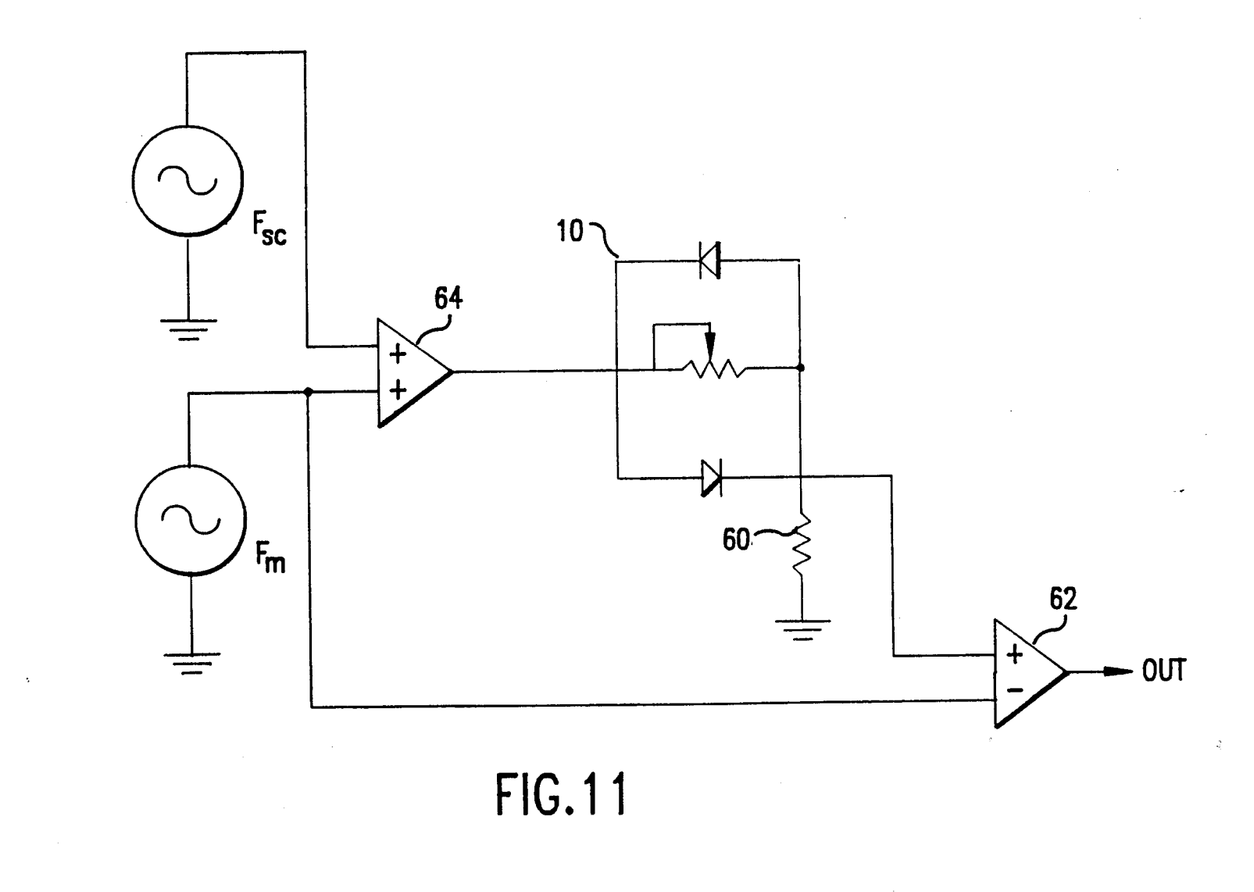

FIG. 11 is an alternate version of the circuit of FIG. 10 where an adder 64 is included to isolate the modulation signal $F_m$ from the subcarrier $F_{sc}$. Otherwise, the two circuits are identical.

Figure 12:
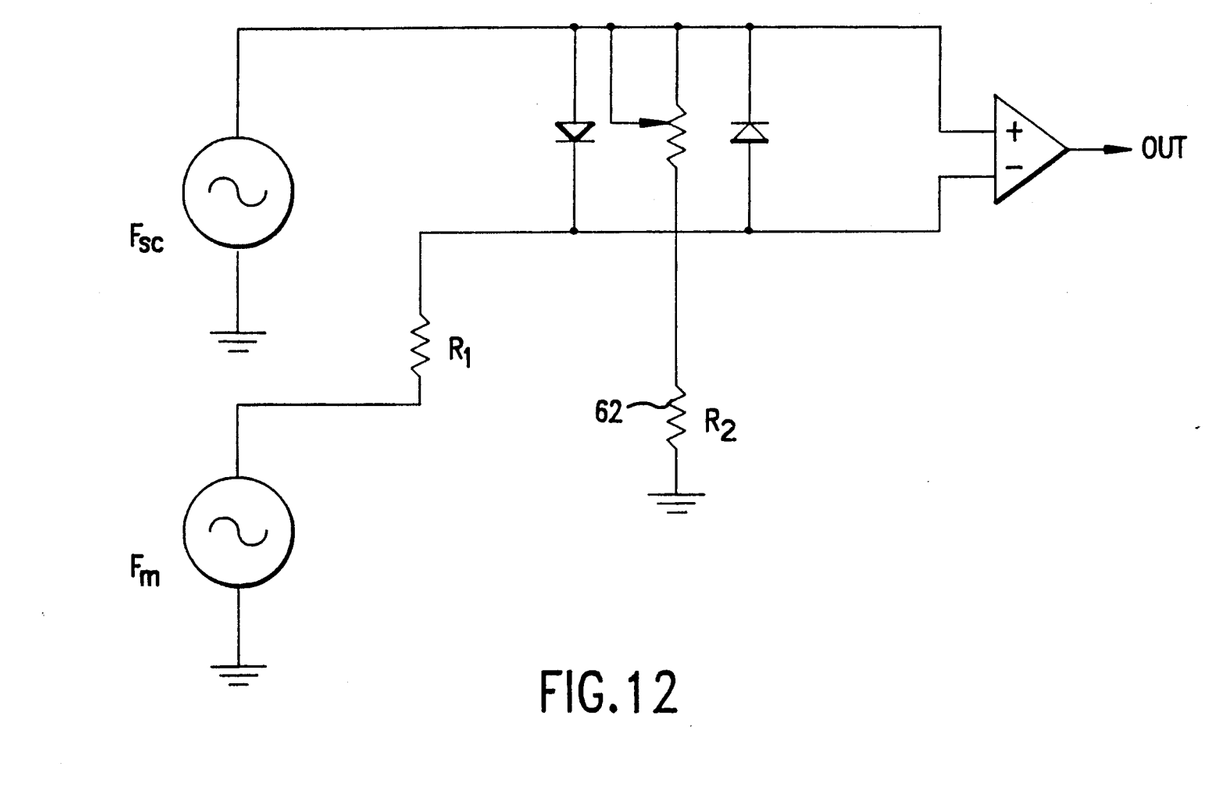
Figure 13:
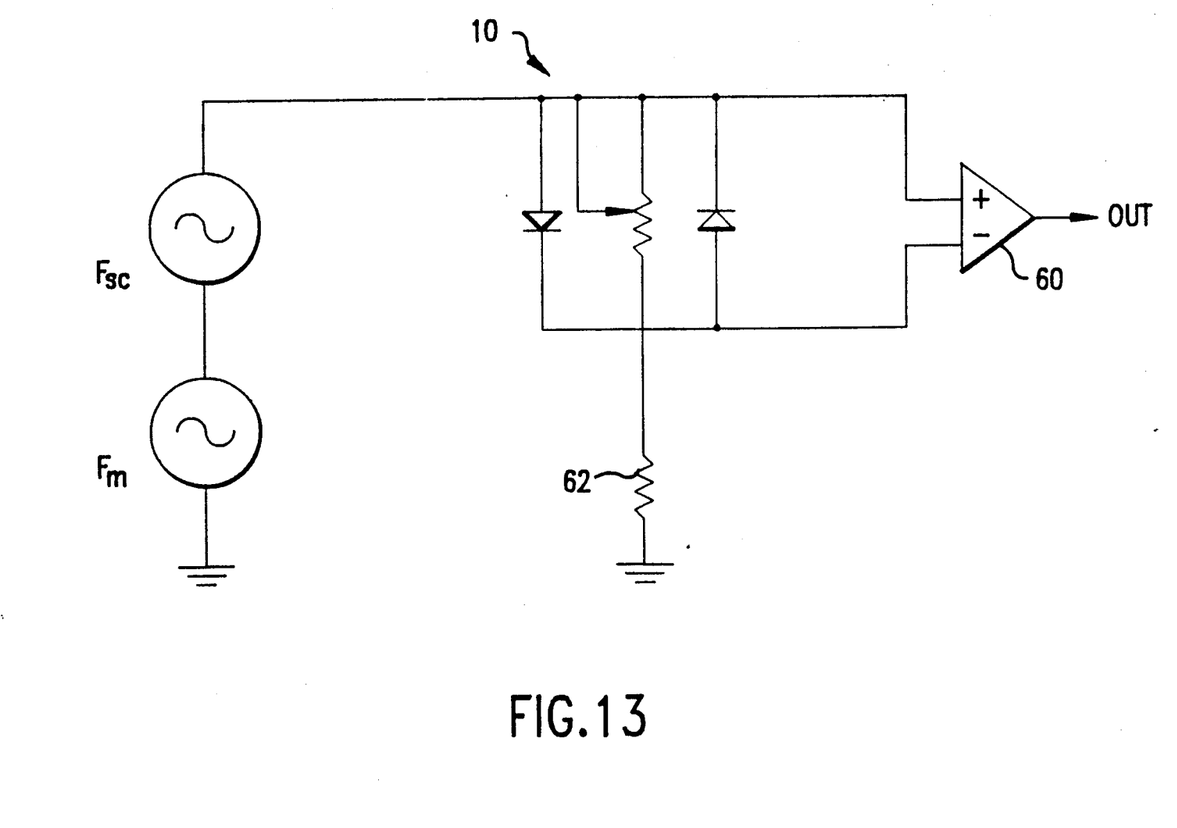

FIG. 12 is an embodiment where the output signal is single ended, i.e., the output is unipolar. The circuit of FIG. 12 is identical to the circuit of FIG. except a differential amplifier 62 is applied across both nodes of the cell 10 to obtain a single ended output. FIG. 13 also provides a single ended output but the modulation signal $F_m$ is not isolated from the subcarrier $F_{sc}$.

Further mathematical studies of the modulator cell 10 of FIG. 1 have shown that the characteristics of the cell are such that it may be approximated by the following equation:

$$\text{Output} = (MI\sin(2\Pi f_m) + \sin(2\Pi f_{sc}))\sin^2(2\Pi f_{sc}) \qquad (1)$$

where
  $f_m$ is the modulation frequency;
  $f_{sc}$ is the subcarrier frequency;
  MI is the modulation index (i.e., the ratio of the amplitude
  of the modulation information to the amplitude of the subcarrier);

Further equation be simplified using trigonometric identities to obtain an equivalent mathematical expression. Assuming the modulation index is equal to 1 to reduce the expression to its simplest form, the equation is as follows:

$$\text{Output} = -\tfrac{1}{2}\sin(2\pi f_m) + \tfrac{1}{2}\sin(2\pi f_{sc}) + \tfrac{1}{2}\sin(2\pi(2f_{sc} - f_m)) - \qquad (2)$$

-continued $$\tfrac{1}{2}\sin(2\pi(2f_{sc}+f_m)) - \tfrac{1}{2}\sin(2\pi(3f_{sc}))$$

Thus, the mathematically approximated output spectrum includes a signal proportional to the modulation information, a signal proportional to the subcarrier, a lower side band signal at $2f_{sc}-f_m$ and an upper sideband at $2f_{sc}+f_m$ and a third harmonic of the subcarrier. As equation 2 further shows, all of the modulation information is in the upper and lower sidebands at the second harmonic of $2f_{sc}$. Therefore, a bandpass filter can be applied to provide as an output signal either the lower sideband signal at $2f_{sc}-f_m$ or the upper sideband signal at $2f_{sc}+f_m$.

The spectrum from Equation 2 is substantially equal to the measured spectrum for the first three harmonics using the cell 10 of FIG. 1. It is believed that the harmonics that result above the third harmonic and the modulation information that is detectable in the odd harmonics at higher values of the modulation index when making measurements of the cell 10 result from the diodes imperfect simulation of the transfer characteristics of equations 1 and 2.

Figure 14:
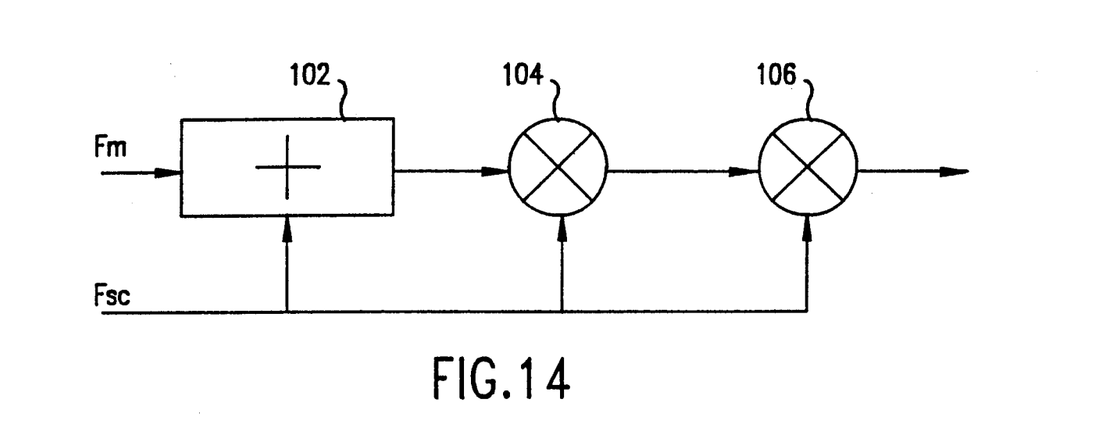
FIG. 14 is a block diagram for yet another alternative embodiment for waveform modulation.

FIG. 14 represents a circuit or cell that may used for modulating the signal according to the present invention pursuant to equations 1 and 2 above. In FIG. 14, the subcarrier $F_{sc}$ is applied to one input of an adder 102, and to the inputs of two multipliers 104 and 106. The amplitude of the modulation information $F_m$ is controlled by a modulation index control (not shown). The resultant output is substantially the same as the output from the modulator cell 10 of FIG. 1. The circuit of FIG. 14 may be implemented through an analog circuit or through the use of one or more digital arithmetic units.

In addition, the demodulated signal for either the transmitted upper or the transmitted lower sideband can be readily obtained in a demodulator. By merely hetrodyning the received sideband by a reconstructed second harmonic of the subcarrier, the modulation information can be obtained:

Received Sideband $=\sin(2\Pi(2f_{sc}-f_m))$ (3)

Hetrodyning Signal $=\cos(2((2\Pi(2f_{sc}))$ (4)

Hetrodyned Signal $=(\cos(2\Pi f_{sc}))(\sin(2\Pi(2f_{sc}-f_m))$ (5)

which can be simplified into the following equation:

Hetrodyned Signal $= \sin(2\pi(2f_{sc} - 2f_{sc} - (-f_m))) +$ (6)

$$\sin(2\pi f_{sc})\cos(2\pi(2f_{sc}-f_m))$$

Hetrodyned
Signal$=-\sin(2\Pi f_m)+\sin(2\Pi 2f_c)\cos(2\Pi(2f_{sc}-f_m))$ (7)

Further, by using a low pass filter, the modulation information can be obtained. Thus, the received information of the circuit of FIG. 14 may readily be demodulated. The hetrodyning signal may be readily obtained from a phase lock loop or other readily available synthesis circuit.

Figure 7:
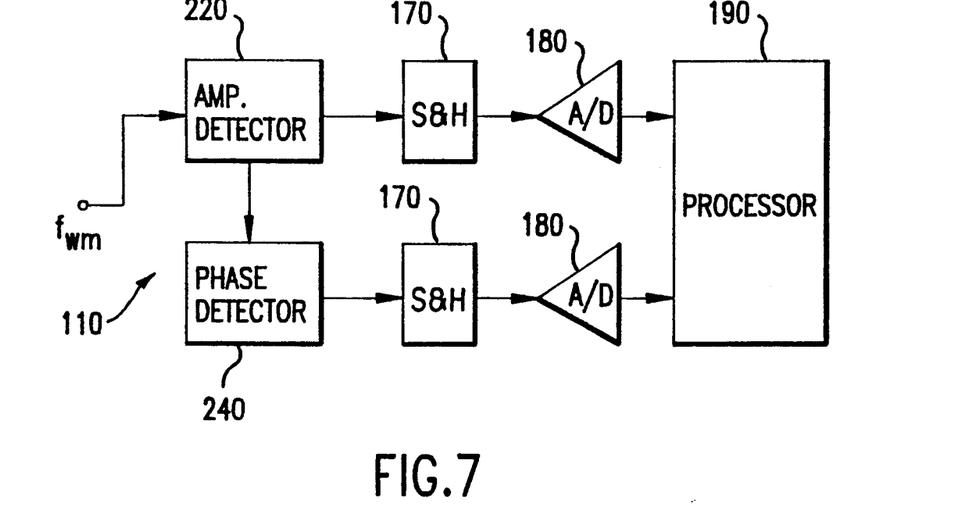
FIG. 7 is a demodulation circuit for a waveform modulated signal.

FIG. 7 represents a circuit for demodulating waveform modulated information. The circuit 110 comprises two detectors, an amplitude detector 220 and a phase detector 240. A processing circuit 190, which can be a microprocessor or a dedicated digital or analog circuit, monitors the phase and amplitude information provided by the two different detectors. If a microprocessor or a digital circuit is used, a sample and hold circuit 170 and an analog to digital converter 180 should be used.

If a microprocessor is used, the microprocessor can compare the measured phase and amplitude signals provided by the two detectors 220 and 240 with predicted values stored in a truth or a logic look-up table. Based upon the truth or logic look-up table, the appropriate voltage for the modulation signal can be reconstructed. Look-up tables are commonly used for demodulating quadrature amplitude modulation signals as described in Tomasi, *Electronic Communication Systems* (Prentice-Hall 1981) and are well known to those of ordinary skill in the art.

To obtain the data for the look up table, one of two techniques may be used. First, an empirical measurement technique may be used by connecting the modulator of FIG. 1 to the demodulator of FIG. 7. A known modulation signal is supplied to the modulator and the sampled and held phase values are recorded for use in the table. Alternatively, the anticipated values may be calculated by using piece-wise linear approximation.

If a dedicated digital circuit is used for the processing circuit 190, a finite state machine can be readily constructed that responds to the appropriate phase and amplitude data to reconstruct the modulated information. If an analog circuit is used, a dedicated circuit can be constructed such that for given analog phase and analog amplitude values, an unique digital signal will be provided at the output of the processing circuit. Such a dedicated circuit can be constructed readily through the use of window comparators and switching circuitry. Preferably, in such analog to digital converters, a sample and hold circuit should be used.

Figure 8:
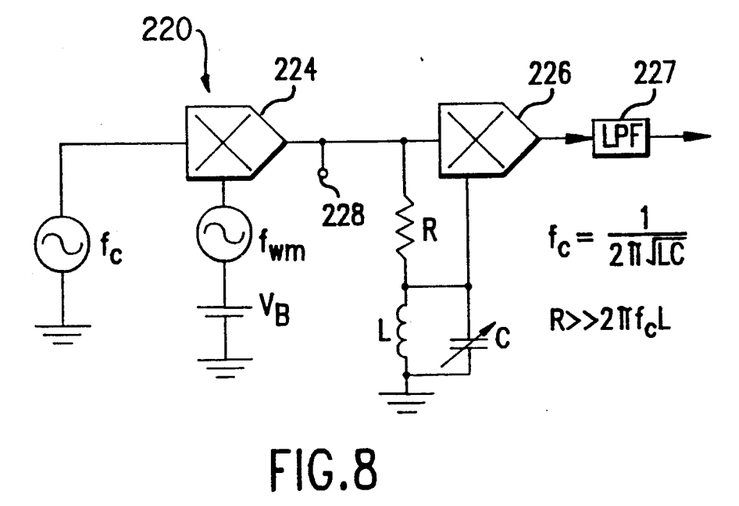
FIG. 8 is the schematic for the amplitude detector shown in FIG. 7.

FIG. 8 shows a detailed circuit for the amplitude detector 220. The amplitude detector receives the waveform modulated signal $F_{wm}$ to which a DC offset $V_B$ is added. $V_B$ should preferably be slightly grater than the peak to peak amplitude of the modulated signal $F_{wm}$. That summed signal is supplied as one input to a first multiplier or balanced modulator 224 and the other input of the multiplier is a synthesized carrier $F_C$. The frequency $f_c$ $F_C$ is twice the frequency of the subcarrier $F_{sc}$ used in the waveform modulator and the carrier $F_C$ may be synthesized by a phase lock loop or by other appropriate circuitry.

The output of the first multiplier 224 is supplied as an input to a second multiplier or balanced modulator 226. The output of a first multiplier is also applied through a divider formed of a resistor R and a resonant tank circuit formed of an inductor L and a capacitor C. The resonant frequency of the tank circuit should be $f_c$ and the resistance of R should be preferably ten or more times greater than the impedance of the inductor at the resonant frequency. The voltage across the resonant circuit is supplied as the other input to the second multiplier 226. The output of the second multiplier 226 is passed through a low pass filter 227 having a cutoff frequency that is between the frequency of the modulated data and the frequency of the carrier.

The output of the filter 227 in the amplitude detector represents the instantaneous amplitude of the waveform modulated signal. In digital implementations, a sample and hold circuit 170 then samples and holds the resultant product signal. To avoid aliasing in the demodulation process, the sampling rate should be at least twice the frequency of the modulation data.

Figure 9:
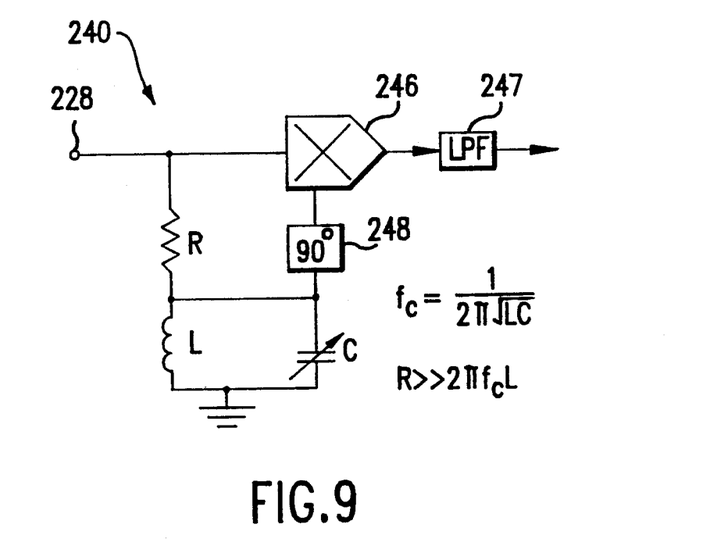
FIG. 9 is the schematic for the phase detector shown in FIG. 8.

The phase data is obtained in a similar manner that is similar to the manner of obtaining the amplitude data and is shown in FIG. 9. A node 228 in FIG. 8 is also provided to an input to a third multiplier or balanced modulator 246 in the phase detector of FIG. 9. The node 228 is also coupled through another divider formed of a resistor having an impedance R to another tank circuit resonant at $f_c$ comprised of a capacitor C and an inductor L. Again, the resistance of resistor R should be 10 or more times greater than the impedance of the inductor at $f_c$. The signal developed across the tank circuit is phase shifted ninety degrees by a phase shifter 248 and supplied to another input of the third multiplier 246. The output of the multiplier is low pass filtered by a filter having the same bandpass characteristics as filter 227. The resultant low pass filtered product signal from the third multiplier 246 provides an instantaneous phase signal that may be sampled and held at a frequency of at least twice the frequency of the modulation signal $F_m$.

Figure 15:
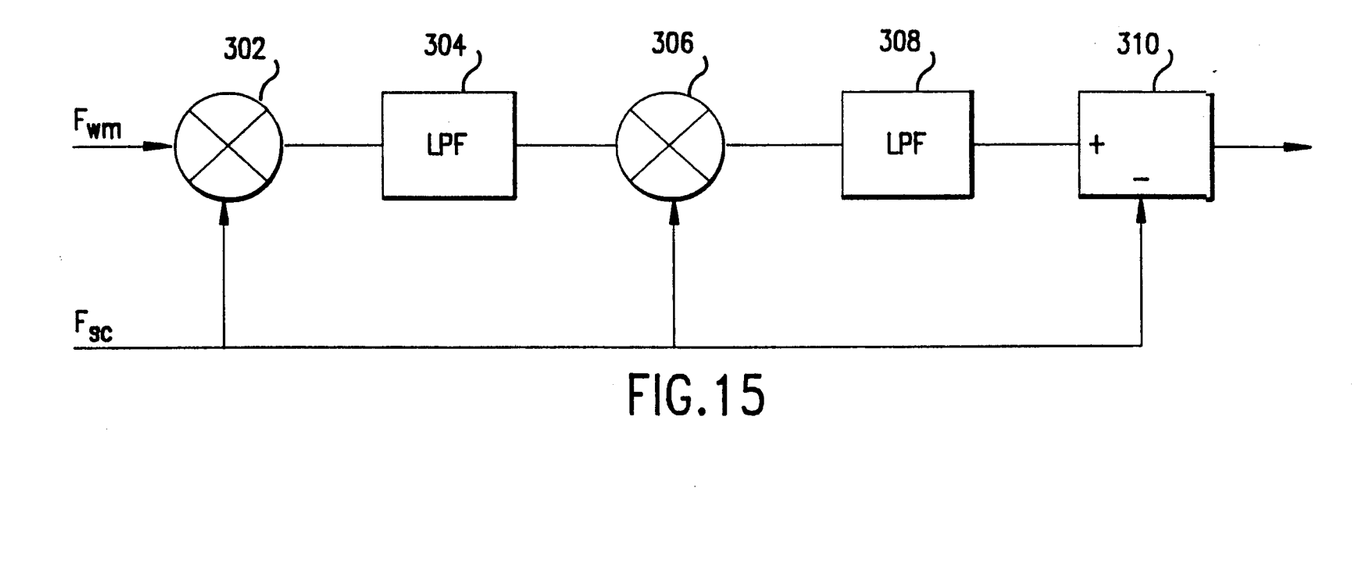
FIG. 15 is a block diagram for yet another alternative embodiment for waveform demodulation

FIG. 15 shows yet another demodulation technique. The received signal Fwm is multiplied in a multiplier 302 by a subcarrier signal Fsc at a frequency of half the carrier frequency. The output is passed through a low pass filter 304 having the frequency characteristics identical to the filter 227. The output of the low pass filter is supplied to a second multiplier 306 that multiplies its input by the subcarrier Fsc. The output of the multiplier 306 is supplied to yet another low pass filter 308 with characteristics identical to the filter 227. The output of the filter is supplied to an analog subtractor 310, which eliminates the subcarrier from the demodulated signal $F_o$. The demodulation technique shown in FIG. 15 may also be done digitally.

In addition, frequency interleaving techniques can be used to avoid artifacts. It has been found that using the modulator cell 10, artifacts in the waveform modulation signal may be detectable by amplitude and frequency modulation detectors operating in precisely the same frequency channel. These artifacts result in a degradation of the received quality of the signal in the co-channel.

To avoid the detection of artifacts, frequency interleaving such as used in the NTSC signal is used.

Thus, the disclosed modulation and demodulation techniques and circuitry for performing those techniques provides an improved form of modulation. Since the disclosed modulation circuitry is
  symmetric about the frequency-amplitude plane, (i.e., purely real and purely imaginary signals) the disclosed method of modulation creates no noticeable artifacts for amplitude and frequency modulation detectors. Therefore, a waveform modulated signal can be transmitted on the same frequency band and at the same time as a frequency or amplitude modulated signal thereby effectively doubling the information capacity of any frequency band. The circuitry for the disclosed modulators can also be readily implemented in integrated circuits either through the use of microprocessors or through the use of analog circuits.

I claim:

1. A modulator cell for modulating a subcarrier signal with a modulation signal comprising:
  a subcarrier signal source:
  a pair of diodes connected in parallel, each diode having an anode and a cathode and wherein the anode of a first diode is coupled to the subcarrier signal source, wherein the anode of the first diode is coupled to the cathode of the second diode so that current flow through the diodes is antiparallel and a resistor coupled in parallel to the diodes; and
  a modulation signal source coupled to the anode of the second diode wherein both the subcarrier and the modulation signal have a peak to peak amplitude and the modulation signal source includes a means for limiting the peak to peak amplitude of the modulation signal to be less than one half of the peak to peak amplitude of the subcarrier signal.

2. The modulator cell of claim 1, wherein the means for limiting comprises a voltage divider and the resistance of the voltage divider limits the peak magnitude of the modulation signal to less than the peak magnitude of the subcarrier signal.

3. An apparatus for modulating a reference signal having a frequency with a modulation signal comprising:
  means for receiving the reference signal to the apparatus;
  means for receiving the modulation signal to the apparatus, wherein the means for receiving the modulation signal includes means for limiting the peak to peak voltage of the modulation signal to less than the peak to peak voltage of the reference signal; and
  a waveform modulator cell receiving both the reference signal and the modulation signal and generating a waveform modulated output signal centered at a frequency twice that of said reference frequency, the modulator cell having a voltage to current transfer curve that is linear in a first region and non-linear in at least a second region.

4. A circuit for modulating a subcarrier with a modulation signal, the circuit comprising a cell including
  a resistive branch; and
  a second and third branch both coupled in parallel to the first branch, wherein current flow in the second and third branches being substantially antiparallel and the current voltage transfer characteristics in the second and third branches being non-linear beyond a certain magnitude range and
  a differential amplifier coupled across the branches to provide a single ended output.

5. A method for modulating a subcarrier having a frequency with a modulation signal to thereby provide an output at a different carrier frequency, the method comprising:
  supplying a modulator cell, having two nodes and a non-linear characteristic current voltage transfer curve that is symmetric about the current axis and circuit elements having a conduction threshold voltage and the subcarrier has a peak to peak amplitude;
  coupling the subcarrier to a first node wherein the step of coupling the subcarrier to the first node includes limiting the peak to peak voltage to a range between 1.5 to 5 times the magnitude of the threshold voltage;
  coupling the modulation signal to the second node; and
  coupling the second node to the output.

6. The method of claim 5, wherein the modulation information has a bandwidth and the step of coupling the second node to the output comprises:

bandpass filtering the signal at the second node with a filter having a bandwidth substantially equal to the bandwidth of the modulation information, and a cutoff frequency of the filter is substantially equal to the carrier frequency.

7. The method of claim 6, where the carrier frequency is twice the frequency of the subcarrier frequency.

8. The method of claim 5, wherein the coupling of the second node to the output further includes coupling both the first and second nodes to a differential amplifier to provide a single-ended output.

9. A modulation cell for modulating a subcarrier with modulation information, wherein the cell comprises:
an adder to provide a sum of the subcarrier with a signal proportional to the modulation information; and
a means for multiplying the sum by the square of the subcarrier.

10. The modulation cell of claim 9 wherein the means for multiplying comprises:
a first multiplier to multiply the sum by the subcarrier to produce a first product; and
a second multiplier to multiply the first product by the subcarrier.

11. The modulation cell of claim 9, wherein the means for multiplying comprises:
a squarer receiving the subcarrier and providing the square of the subcarrier; and
a multiplier to multiply the sum by the square of the subcarrier.

12. A method for modulating a subcarrier signal with a modulation signal, the method comprising:
adding a signal proportional to the modulation signal to the subcarrier signal to produce a sum; and
multiplying the sum by a signal proportional to the square of the subcarrier signal.

13. A communications method for transmitting an output signal bearing a frequency relationship to a supplied subcarrier with information based upon a modulation signal, the method comprising:
adding a signal proportional to the modulation signal to the subcarrier signal to produce a sum;
multiplying the sum by a signal proportional to the square of the subcarrier signal;
bandpass filtering to obtain the output signal in a frequency band selected based upon the frequency relationship;
transmitting the output of the bandpass filter over a medium;
receiving the transmitted output; and
demodulating the transmitted output.

* * * * *